US009847367B2

(12) United States Patent
Ho

(10) Patent No.: US 9,847,367 B2
(45) Date of Patent: Dec. 19, 2017

(54) DIGITAL X-RAY DETECTOR AND METHOD FOR REPAIRING A BAD PIXEL THEREOF

(71) Applicant: Hydis Technologies Co., Ltd., Gyeonggi-do (KR)

(72) Inventor: Jang Jong Ho, Seoul (KR)

(73) Assignee: Hydis Technologies Co., Ltd., Gyeonggi-do (KR)

(\*) Notice: Subject to any disclaimer, the term of this patent is extended or adjusted under 35 U.S.C. 154(b) by 0 days.

(21) Appl. No.: 15/452,176

(22) Filed: Mar. 7, 2017

(65) Prior Publication Data

US 2017/0179187 A1 Jun. 22, 2017

Related U.S. Application Data

(63) Continuation of application No. 14/700,752, filed on Apr. 30, 2015, now Pat. No. 9,634,056.

(30) Foreign Application Priority Data

Jan. 29, 2015 (KR) .................. 10-2015-0014359

(51) Int. Cl.
*H01L 29/49* (2006.01)
*H01L 27/146* (2006.01)

(52) U.S. Cl.
CPC .. *H01L 27/14663* (2013.01); *H01L 27/14603* (2013.01); *H01L 27/14612* (2013.01); *H01L 27/14689* (2013.01)

(58) Field of Classification Search
CPC ......... H01L 27/14663; H01L 27/14603; H01L 27/14612; H01L 27/14689
See application file for complete search history.

(56) References Cited

U.S. PATENT DOCUMENTS 9,634,056 B2 * 4/2017 Ho .................. H01L 27/14663
9,773,824 B2 * 9/2017 Shieh ............... H01L 27/14609
(Continued)

FOREIGN PATENT DOCUMENTS

KR 102008000859 A 1/2008
KR 102011006781 A 6/2011

OTHER PUBLICATIONS

Office Action dated Nov. 19, 2015 in Korean Application No. 1020150014359.
(Continued)

*Primary Examiner* — Michael Shingleton
(74) *Attorney, Agent, or Firm* — Saliwanchik, Lloyd & Eisenschenk

(57) ABSTRACT

Provided herein is a digital x-ray detector and a method for repairing a bad pixel thereof, the detector including a substrate; a gate line and a data line formed on the substrate such that the gate line and the data line intersect each other to form a pixel domain; a thin film transistor formed within the pixel domain such that the thin film transistor is adjacent to a portion where the gate line and the data line intersect each other, the thin film transistor including a gate electrode, an active layer, a source electrode and a drain electrode; a PIN diode which is formed within the pixel domain and which includes a lower electrode connected to the source electrode of the thin film transistor, a PIN layer formed on the lower electrode, and an upper electrode formed on the PIN layer; a bias line connected to the upper electrode of the PIN diode; and a scintillator arranged above the PIN diode, wherein on at least one of a surface of the drain electrode which faces the PIN diode and a surface of the PIN diode which faces the drain electrode, a groove is formed such that it expands a distance between the drain electrode and the PIN diode.

6 Claims, 5 Drawing Sheets

(56) References Cited

U.S. PATENT DOCUMENTS

2016/0018535 A1* 1/2016 Lee .................... H01L 27/1461
  250/361 R
2016/0026044 A1  1/2016 Nam
2017/0154915 A1* 6/2017 Tomiyasu ......... H01L 27/14663

OTHER PUBLICATIONS

Notice of Allowance dated Dec. 7, 2016 in U.S. Appl. No. 14/700,752.

* cited by examiner

Prior Art

Prior Art

Prior Art

DIGITAL X-RAY DETECTOR AND METHOD FOR REPAIRING A BAD PIXEL THEREOF

CROSS-REFERENCE TO RELATED APPLICATION

This application is a continuation of U.S. application Ser. No. 14/700,752, filed Apr. 30, 2015; which claims the benefit under 35 U.S.C. §119 of Korean Patent Application No. 10-2015-0014359, filed Jan. 29, 2015, which are hereby incorporated by reference in their entirety.

BACKGROUND

Field of Invention

The following description relates to a digital x-ray detector wherein a PIN diode may be prevented from being damaged in a process of repairing a bad pixel using laser, and a method for repairing the bad pixel thereof.

Description of Related Art

Methods for detecting an x-ray include a method of directly detecting an x-ray and a method of indirectly detecting an x-ray by converting the x-ray into a visible ray and then detecting the x-ray using the visible ray.

An x-ray detector using the aforementioned indirect method consists of an element to convert an x-ray into a visible ray, an element to convert the visible ray into an electronic signal, and an element to convert the electronic signal into an image signal. In other words, the x-ray detector using the indirect method is an apparatus configured to convert an emitted x-ray eventually into an image signal.

Hereinafter, a conventional indirect type digital x-ray detector (hereinafter referred to as a 'digital x-ray detector') will be explained with reference to the drawings attached.

FIG. 1 is a schematic cross-sectional view illustrating a conventional digital x-ray detector; FIG. 2 is a schematic top view of the conventional digital x-ray detector; and FIG. 3 is an enlarged view of major parts of FIG. 2.

As illustrated in FIGS. 1 to 3, the conventional digital x-ray detector includes a substrate 10, a gate line 20 and a data line 30 disposed on the substrate 10 such that the gale line and the data line intersect each other, a thin film transistor 40 formed on an intersecting region of the gate line 20 and the data line 30, a PIN diode 50 disposed on a pixel domain, a bias line 60 disposed above the PIN diode 50 such that it is parallel to the data line 30, and a scintillator 70.

The thin film transistor 40 is formed on the substrate 40, and includes a gate electrode 21, an active layer 41, a source electrode 42 and a drain electrode 43.

The PIN diode 50 includes a lower electrode 51 that is electrically connected to the thin film transistor 20; a layer 52 that includes a P (Positive) type semiconductor layer, an I (Intrinsic) type semiconductor layer, and an N (Negative) type semiconductor layer successively deposited on the lower electrode 51; and an ITO upper electrode 53.

The scintillator 70 is formed on the PIN diode 50 and serves to convert an x-ray into a visible ray.

Hereinafter, operations of such a conventional digital x-ray detector will be explained.

When an x-ray is emitted to the scintillator 70, the x-ray is converted into a visible ray in the scintillator 70, and then the visible ray is transmitted to the PIN diode 50. The visible ray transmitted to the PIN diode 50 is converted into an electronic signal in the PIN diode 50, and the converted electronic signal is converted into an image signal through the thin film transistor, and is then displayed.

Generally, in a digital x-ray detector, from a minimum of tens of thousands up to a maximum of tens of millions of pixels are formed with different sizes and resolutions, and thus it would take too much failure cost to manufacture an array substrate such that all those tens of thousands or tens of millions of pixels operate normally. Therefore, array substrates of fair quality if not the best quality are being manufactured as long as they satisfy minimum requirements.

However, due to the recent increasing demand from customers to improve the display quality, efforts are being made for processes that could repair bad pixels.

Specifically, after an x-ray is converted into a visible ray in a scintillator, the visible ray is converted into an electronic signal in a PIN diode, and then the converted electronic signal is displayed as an image signal after going through a thin film transistor. Herein, should there be a bad pixel that retains its state of being bright spot, the bright spot will be clearly recognizable. Accordingly, efforts are being made to provide a repair process that could keep the bad pixel in a state of a dark spot.

It is generally easy for a human eye to recognize a white spot on a black background than a black spot on a white background, and thus to reduce the recognizability of a bad pixel, it is general to darkening or blackening the bad pixel.

Therefore, when manufacturing an array substrate for a digital x-ray detector, a bright bad pixel is repaired to appear darker while leaving a dark bad pixel as it is, thereby reducing the recognizability of the bad pixels.

In an array substrate for a conventional digital x-ray detector, darkening a bad pixel is performed by cutting a drain electrode 43 ("A" part shown in dotted lines in FIG. 3) of the thin film transistor 40 by emitting a laser.

However, in the pattern design of an array substrate of such a conventional digital x-ray detector, the distance between the drain electrode 43 and a PIN diode is too close to perform the repair process, and thus the PIN diode 50 may be damaged by the laser in the process of cutting the drain electrode 43 using the laser, and when the PIN diode 50 is damaged, the unstable state of a current may affect a PIN diode of a neighboring pixel as well, causing the PIN diode 50 of the neighboring pixel to malfunction. Thus, performing the process of repairing a bad pixel is not easy.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A purpose of the present disclosure is to resolve the aforementioned problems of prior art, that is to provide a digital x-ray detector with an increased distance between a drain electrode and a PIN diode so that the PIN diode may be prevented from being damaged during a process of repairing a bad pixel wherein laser is used, and a method for repairing the bad pixel thereof.

According to an aspect, there is provided a digital x-ray detector comprising: a substrate; a gate line and a data line formed on the substrate such that the gate line and the data line intersect each other to form a pixel domain; a thin film transistor formed within the pixel domain such that the thin film transistor is adjacent to a portion where the gate line and the data line intersect each other, the thin film transistor including a gate electrode, an active layer, a source electrode and a drain electrode; a PIN diode which is formed within the pixel domain and which includes a lower electrode connected to the source electrode of the thin film transistor, a PIN layer formed on the lower electrode, and an upper electrode formed on the PIN layer; a bias line connected to the upper electrode of the PIN diode; and a scintillator arranged above the PIN diode, wherein on at least one of a surface of the drain electrode which faces the PIN diode and a surface of the PIN diode which faces the drain electrode, a groove is formed such that it expands a distance between the drain electrode and the PIN diode.

Herein, the groove may be formed on an area between the data line and the active layer of the thin film transistor.

Furthermore, the groove may include a first groove formed on the drain electrode side, and a second groove formed on the PIN diode side, the first groove and the second groove facing each other.

According to another aspect, there is provided a method for repairing a bad pixel of a digital x-ray detector comprising a substrate; a gate line and a data line formed on the substrate such that the gate line and the data line intersect each other to form a pixel domain; a thin film transistor formed within the pixel domain such that the thin film transistor is adjacent to a portion where the gate line and the data line intersect each other, the thin film transistor including a gate electrode, an active layer, a source electrode and a drain electrode; a PIN diode which is formed within the pixel domain and which includes a lower electrode connected to the source electrode of the thin film transistor, a PIN layer formed on the lower electrode, and an upper electrode formed on the PIN layer; a bias line connected to the upper electrode of the PIN diode; and a scintillator arranged above the PIN diode, wherein on at least one of a surface of the drain electrode which faces the PIN diode and a surface of the PIN diode which faces the drain electrode, a groove is formed such that it expands a distance between the drain electrode and the diode, the method comprising the following steps: detecting the bad pixel by inspecting the digital x-ray detector; and darkening the detected bad pixel by cutting the drain electrode using laser at the position of the drain electrode corresponding to the groove.

Various aforementioned aspects of the present disclosure have an effect of providing a digital x-ray detector with an increased distance between a drain electrode and a PIN diode so that the PIN diode may be prevented from being damaged during a process of repairing a bad pixel wherein laser is used, and a method for repairing the bad pixel thereof.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the systems, apparatuses, and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, a digital x-ray detector according to a first embodiment of the present disclosure will be explained in detail with reference to the drawings attached.

Figure 1:
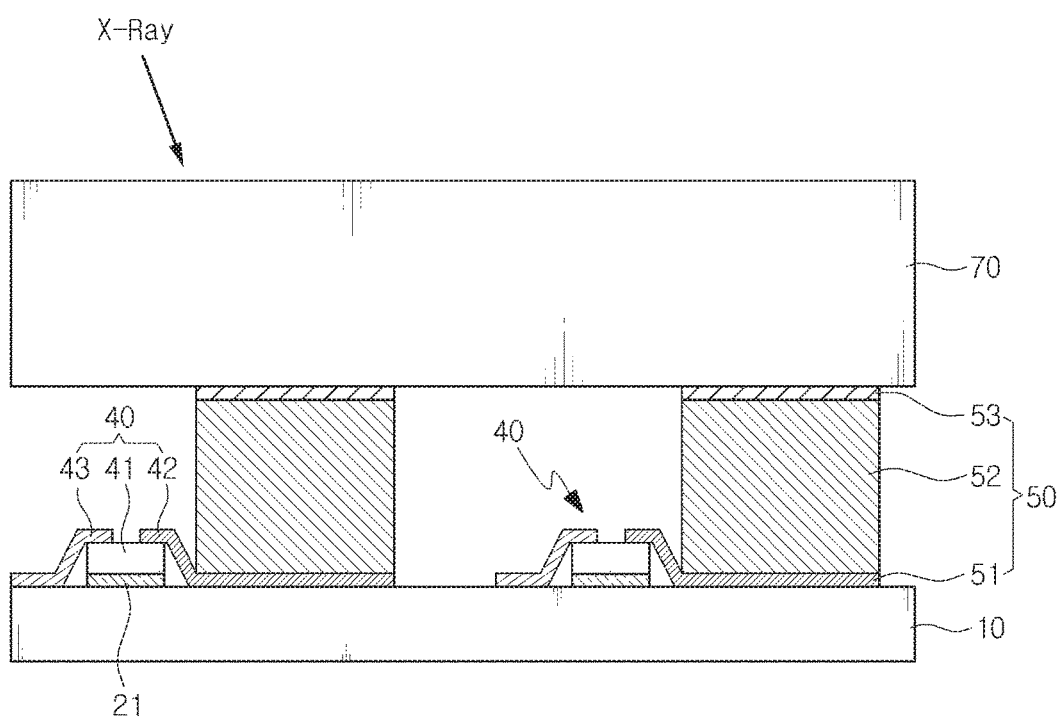
FIG. 1 is a schematic cross-sectional view illustrating a conventional digital x-ray detector.
Figure 2:
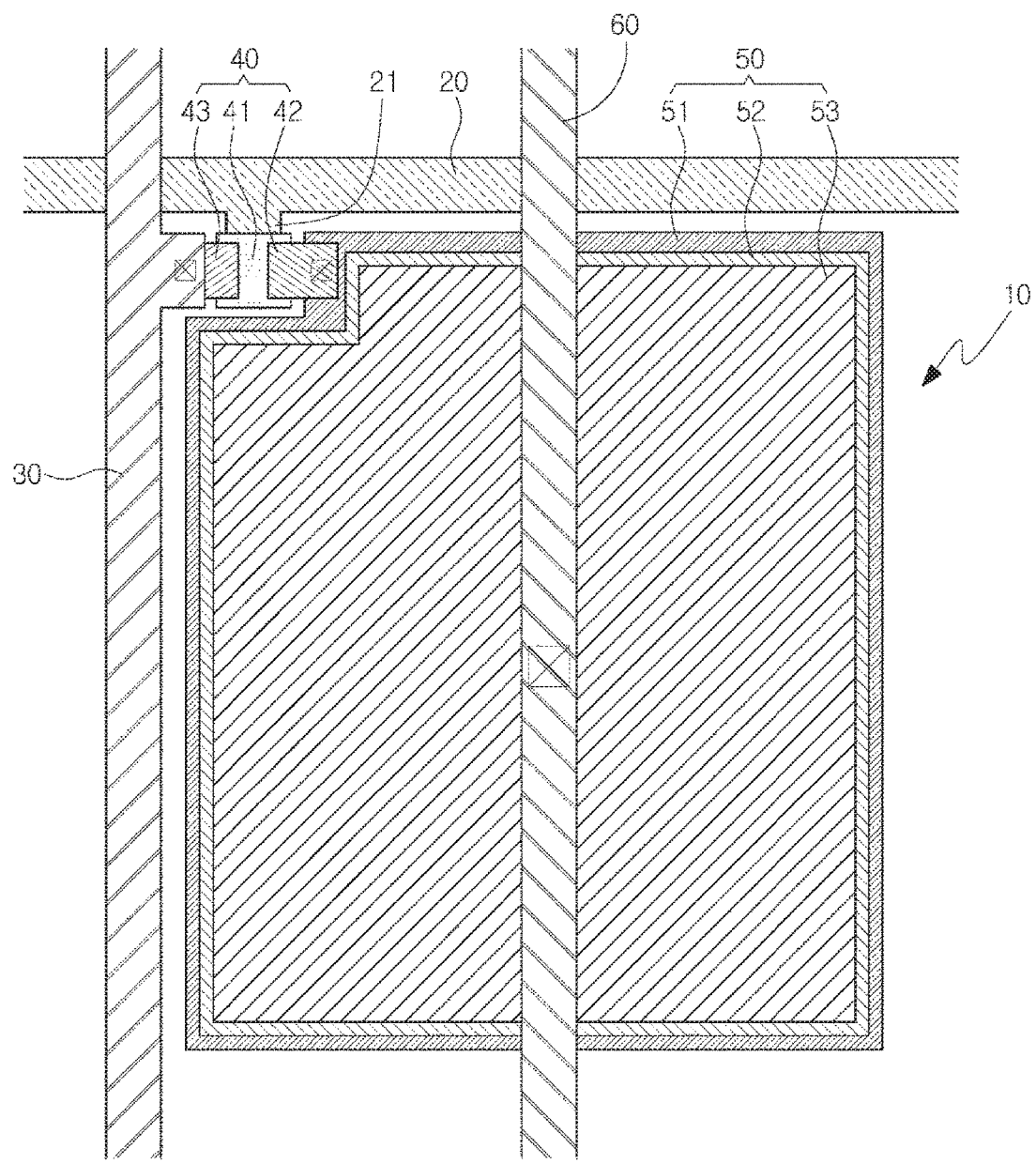
FIG. 2 is a schematic top view of the conventional digital x-ray detector.
Figure 3:
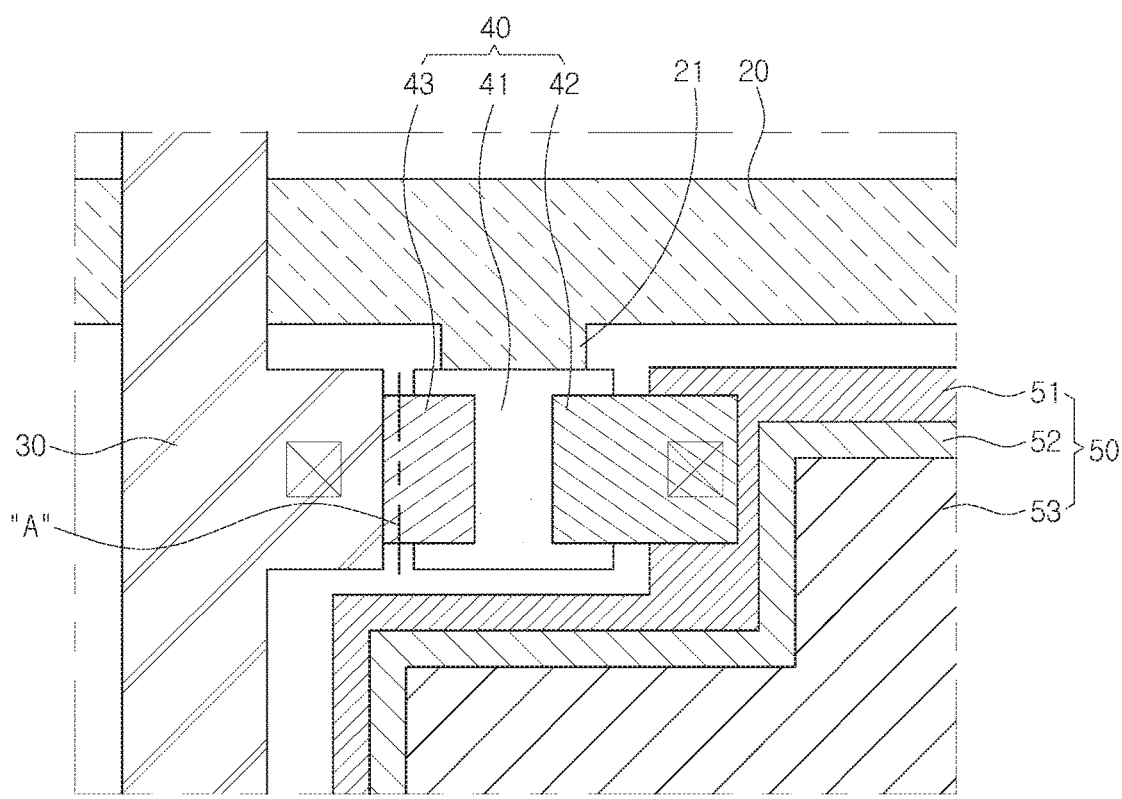
FIG. 3 is an enlarged view of the main parts of FIG. 2.
Figure 4:
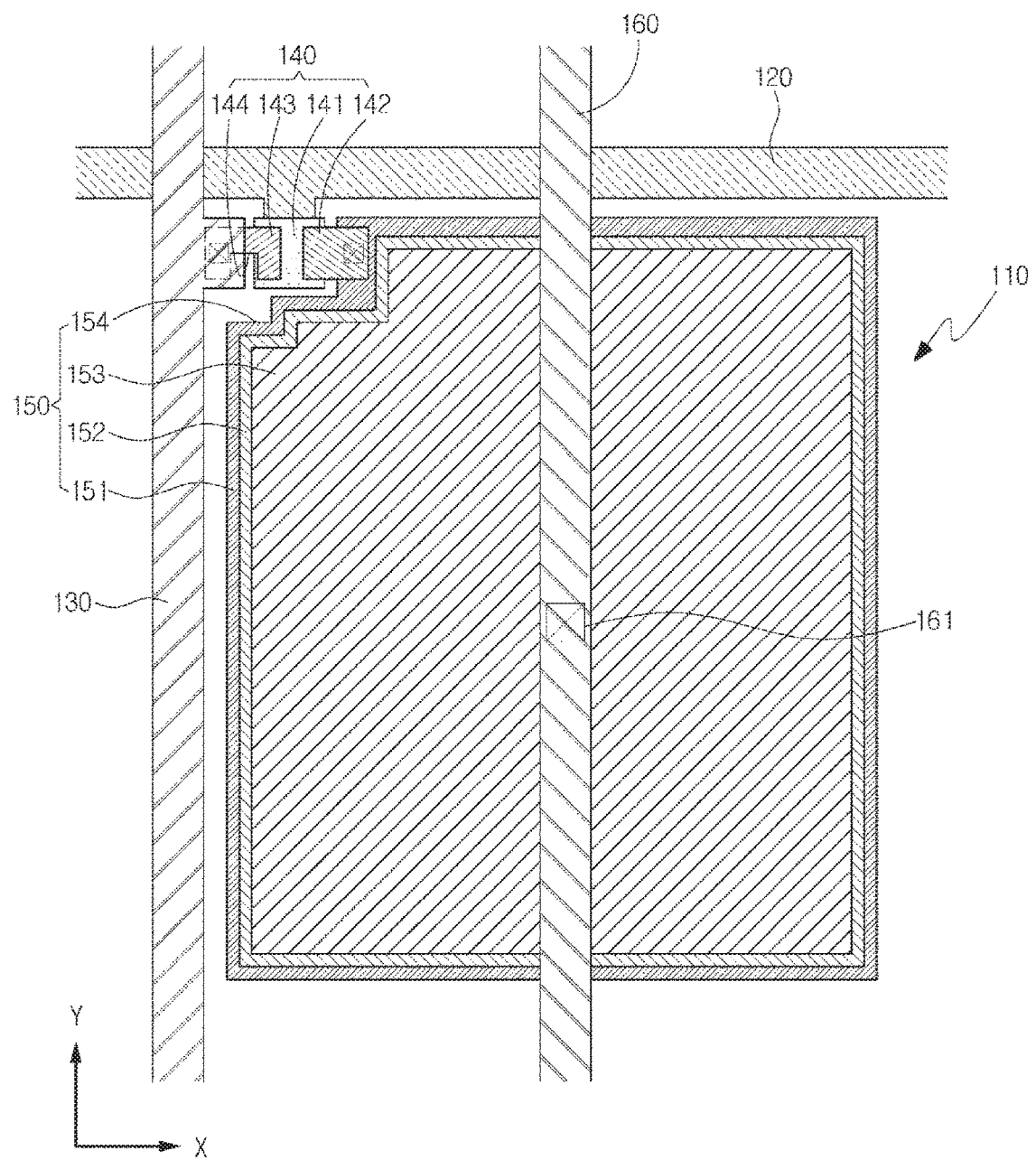
FIG. 4 is a schematic top view of the digital x-ray detector according to the present disclosure.
Figure 5:
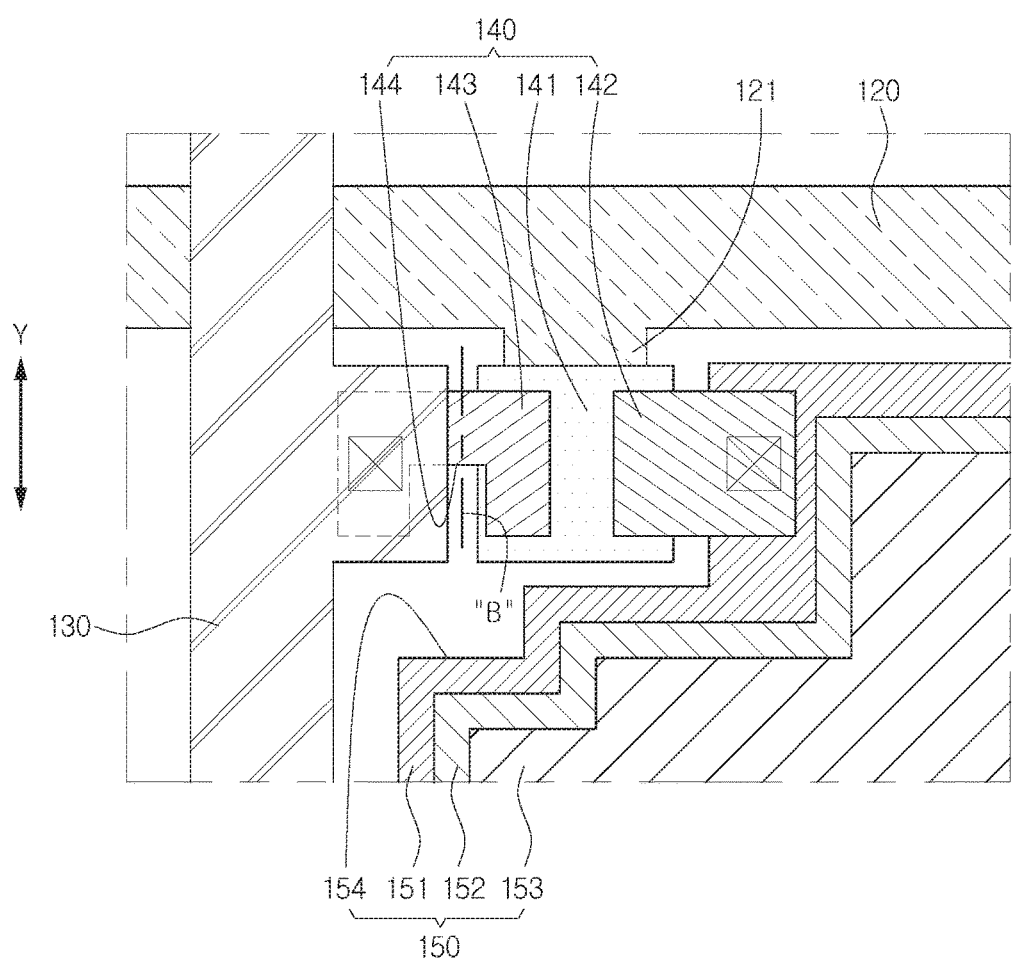
FIG. 5 is an enlarged view of the main parts of FIG. 4.

FIG. 4 is a schematic top view of a digital x-ray detector of the present disclosure; and FIG. 5 is an enlarged view of the main parts of FIG. 4.

The digital x-ray detector according to the first embodiment of the present disclosure illustrated in FIGS. 4 and 5 includes a substrate 110, a gate line 120, a data line 130, a thin film transistor 140, a PIN diode 150, a bias line 160 and a scintillator (not illustrated).

The gate line 120 is arranged on the substrate HO in a first direction, for example, an X axis direction of the figure, and the data line 130 is arranged on the substrate 110 in a second direction that is perpendicular to the first direction, for example, a Y axis direction. That is, the gate line 120 and the data line 130 are arranged such that they intersect each other and form a pixel domain.

The thin film transistor 140 is arranged within the pixel domain such that it is adjacent to where the gate line 120 and the data line 130 intersect each other, and the thin film transistor 140 includes a gate electrode 121 protruding from one side of the gate line 120, an active layer 141 formed above the gate electrode 121, a drain electrode 143 protruding from one side of the data line 130 and super posed on one side of the active layer 141, and a source electrode 142 superposed on the other side of the active layer 141.

Herein, the gate electrode 121 extends from the gate line 120. Therefore, the gate electrode 121 may be made of a same substance and in the same process as the gate line 120.

The active layer 141 is formed on the gate electrode 121 and below the source electrode 142 and drain electrode 143, and may include an ohmic contact layer doped with an impurity formed on a region where it contacts the source electrode 142 and drain electrode 143. That is, the active layer 141 is formed on a middle layer between the gate electrode 121, and the source electrode 142 and drain electrode 143, so as to serve as a channel through which electrons move.

The source electrode 142 is formed on one side of the active layer and is electrically connected to the PIN diode. Therefore, an electronic signal converted at the PIN diode 150 is transmitted to the active layer through the source electrode 142 of the thin film transistor 140.

The drain electrode 143 is formed on the other side of the active layer that faces the source electrode 142. The drain electrode 143 may be electrically connected to the data line 130 through a predetermined contact hole. Therefore, the electronic signal goes through the drain electrode 143 of the thin film transistor 140 and through the data line 130 connected to the drain electrode 143, and is then displayed as an image signal.

The PIN diode 150 is electrically connected to the source electrode 142 of the thin film transistor 140. The PIN diode 150 converts the visible ray into an electronic signal and transmits the converted electronic signal to the source electrode 142.

The PIN diode 150 includes a lower electrode 151 electrically connected to the source electrode 142, a PIN layer 152 formed on the lower electrode 151, and an upper electrode 153 formed on the PIN layer 152. The PIN layer 152 serves to convert the visible ray into the electronic signal. Specifically, the PIN layer 152 includes a P (Positive) type semiconductor layer, an I (Intrinsic) type semiconductor layer, and an N (Negative) type semiconductor layer, and the N type semiconductor layer, the I type semiconductor layer, and the P type semiconductor layer may be deposited successively on the lower electrode 151. When a visible ray is emitted to such a PIN layer 152, the I type semiconductor layer is depleted by the P type semiconductor layer and the N type semiconductor layer, and generates an electric field inside thereof. A positive hole and electron generated by the ray are drifted by the electric field, and then collected in the P type semiconductor layer and N type semiconductor layer, respectively.

The bias line 160 may be electrically connected to the upper electrode 153 of the PIN diode 150 through a predetermined contact hole 161.

The scintillator (not illustrated) is formed above the PIN diode 150, and serves to convert an x-ray into a visible ray.

According to the embodiment of the present disclosure, on a surface of the drain electrode 143 facing the PIN diode 150, a first groove 144 is formed that partially reduces a width of the drain electrode 143 in the first direction (X axis). Herein, the first groove 144 is desirably formed where the drain electrode 143 is cut off in a repairing process using laser aimed at making a bad pixel darker, that is between the data line 130 and the active layer 141.

Furthermore, on a surface of the PIN diode facing the drain electrode 143, a second groove 154 is formed to distance the PIN diode 150 away from the drain electrode 143. Herein, the second groove 154 faces the first groove 144.

The first groove 144 and the second groove 154 expands the distance between the drain electrode 143 and the PIN diode 150, thereby distancing the drain electrode 143 away from the PIN diode 150. Accordingly, it is possible to prevent the PIN diode from being damaged in a process of cutting the drain electrode using laser when repairing a bad pixel.

A width of the first groove 144 and the second groove 154 in the first direction (X axis) and a depth of the first groove 144 and the second groove 154 in the second direction (Y axis) are desirably set up such that they minimize a photoelectronic signal conversion efficiency of the PIN diode 150 and electrical characteristics of the drain electrode 143 within a range that the Pin diode 150 is not damaged during the repairing process using laser.

A method for repairing a bad pixel by making the bad pixel darker in the aforementioned digital x-ray detector is explained hereinafter.

The method for repairing a bad pixel by making the bad pixel darker according to the embodiment of the present disclosure includes a step of detecting the bad pixel, and a step of making the bad pixel darker.

The detecting the bad pixel may involve evenly emitting an x-ray on an entirety of surface of the digital x-ray detector, and detecting the bad pixel by determining whether or not there is the bad pixel using an image signal being output from the digital x-ray detector.

The making the bad pixel darker may involve cutting the drain electrode 143 of the bad pixel detected in the detecting of the bad pixel using laser, and making the bad pixel darker. Herein, the cut portion of the drain electrode 143 using laser may be the portion where the first groove 144 is formed ("B" part shown in dotted lines in FIG. 5).

In such a method for repairing a bad pixel of the digital x-ray detector of the present disclosure, during the process of cutting the drain electrode 143 using laser, the laser is distanced away from the PIN diode 150 as much as the depth of the first groove 144 in the second direction (Y axis). Therefore, it is possible to prevent the PIN diode 150 from being damaged in the repairing process, thereby increasing the yield rate of the panel.

Furthermore, since on the surface of the PIN diode 150 facing the drain electrode 143, the second groove 154 is formed such that it corresponds to the first groove 144, the PIN diode 150 is further distanced from the drain electrode 143 that is subjected to the cutting by the laser, by as much as the depth of the second groove 154 in the second direction (Y axis). Therefore, it is possible to significantly reduce the possibility that the PIN diode 150 is damaged by the laser in the process of repairing the bad pixel by cutting the drain electrode 143 with laser.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

REFERENCE NUMERALS

110: SUBSTRATE
120: GATE LINE
121: GATE ELECTRODE
130: DATA LINE
140: THIN FILM TRANSISTOR
141: SOURCE ELECTRODE
142: ACTIVE LAYER
143: DRAIN ELECTRODE
144: FIRST GROOVE
150: PIN DIODE
151: LOWER ELECTRODE
152: PIN LAYER
153: UPPER ELECTRODE
154: SECOND GROOVE
160: BIAS LINE
161: CONTACT HOLE

What is claimed is:

1. A method for manufacturing a digital x-ray detector comprising a substrate; a gate line and a data line formed on the substrate such that the gate line and the data line intersect each other to form a pixel domain; a thin film transistor formed within the pixel domain such that the thin film transistor is adjacent to a portion where the gate line and the data line intersect each other, the thin film transistor including a gate electrode, an active layer, a source electrode and a drain electrode; a diode which is formed within the pixel domain and which includes a lower electrode connected to the source electrode of the thin film transistor, a PIN layer formed on the lower electrode, and an upper electrode formed on the PIN layer; a bias line connected to the upper electrode of the PIN diode; and a scintillator arranged above the PIN diode, wherein the method comprises a step of forming a groove on at least one of a surface of the drain electrode which faces the PIN diode and a surface of the diode which faces the drain electrode, such that the groove increases a distance between the drain electrode and the PIN diode.

2. The method according to claim 1, wherein the groove is formed on an area between the data line and the active layer of the thin film transistor.

3. The method according to claim 2, wherein the groove includes a first groove formed on the drain electrode side, and a second groove formed on the PIN diode side, the first groove and the second groove are arranged to face each other.

4. The method according to claim 1, further comprising the following steps:

detecting the bad pixel by inspecting the digital x-ray detector; and darkening the detected bad pixel by cutting the drain electrode using laser at a location of the drain electrode corresponding to the groove.

5. The method according to claim 2, further comprising the following steps:

detecting the bad pixel by inspecting the digital x-ray detector; and darkening the detected bad pixel by cutting the drain electrode using laser at a location of the drain electrode corresponding to the groove.

6. The method according to claim 3, further comprising the following steps:

detecting the bad pixel by inspecting the digital x-ray detector; and darkening the detected bad pixel by cutting the drain electrode using laser a location of the drain electrode corresponding to the groove.

\* \* \* \* \*

UNITED STATES PATENT AND TRADEMARK OFFICE
CERTIFICATE OF CORRECTION

PATENT NO. : 9,847,367 B2  
APPLICATION NO. : 15/452176  
DATED : December 19, 2017  
INVENTOR(S) : Jang Jong Ho Page 1 of 1

It is certified that error appears in the above-identified patent and that said Letters Patent is hereby corrected as shown below:

In the Specification

Column 3,  
Line 37, "and the diode," should read --and the PIN diode,--.

Column 4,  
Line 30, "on the substrate HO" should read --on the substrate 110--.

In the Claims

Column 7,  
Line 10, "drain electrode; a diode" should read --drain electrode; a PIN diode--.  
Line 19, "a surface of the diode" should read --a surface of the PIN diode--.

Signed and Sealed this  
Twenty-first Day of August, 2018

Andrei Iancu  
*Director of the United States Patent and Trademark Office*